United States Patent [19]
Freund et al.

[11] Patent Number: 6,164,454
[45] Date of Patent: *Dec. 26, 2000

[54] APPARATUS AND METHOD FOR STORING SEMICONDUCTOR OBJECTS

[75] Inventors: Joseph Michael Freund, Fogelsville; George John Przybylek, Douglasville; Dennis Mark Romero, Allentown, all of Pa.

[73] Assignee: Lucent Technologies Inc., Murray Hill, N.J.

[ * ] Notice: This patent is subject to a terminal disclaimer.

[21] Appl. No.: 09/135,420

[22] Filed: Aug. 17, 1998

Related U.S. Application Data

[63] Continuation-in-part of application No. 08/970,982, Nov. 14, 1997, Pat. No. 5,899,730.
[51] Int. Cl.[7] ............................ B65D 85/00; B65D 71/08; B65B 53/02
[52] U.S. Cl. ............................ 206/706; 53/442; 206/710; 206/724; 206/497
[58] Field of Search ..................................... 206/706, 710, 206/724, 497; 29/413; 436/464, 460; 53/442

[56] References Cited

U.S. PATENT DOCUMENTS

| | | | |
|---|---|---|---|
| 3,562,058 | 2/1971 | Boyd | 206/710 X |
| 3,606,035 | 9/1971 | Gantley | 29/413 X |
| 4,203,127 | 5/1980 | Tegge, Jr. | 206/710 |
| 4,644,639 | 2/1987 | Atteberry et al. | 438/464 X |
| 4,778,326 | 10/1988 | Althouse et al. | 206/710 X |
| 4,852,743 | 8/1989 | Ridgeway | 206/724 X |
| 5,288,663 | 2/1994 | Ueki | 436/460 |
| 5,899,730 | 5/1999 | Freund et al. | 438/464 |

*Primary Examiner*—Bryon P. Gehman
*Attorney, Agent, or Firm*—Gibbons, Del Deo, Dolan, Griffinger & Vecchione

[57] ABSTRACT

A storage container for semiconductor objects is disclosed. The invention has a mounting structure having an inner frame, a temperature sensitive adherent film and an outer frame. Semiconductor objects are placed on the temperature sensitive adherent and covered. The cover does not touch the semiconductor objects because it has a spacer made of non-stick material. The invention stores semiconductor objects for a relatively long period of time in a safe and secure manner with minimal threat of breakage.

14 Claims, 5 Drawing Sheets

APPARATUS AND METHOD FOR STORING SEMICONDUCTOR OBJECTS

RELATED APPLICATIONS

The present patent application is a continuation-in-part of U.S. patent application Ser. No. 08/970,982 filed Nov. 14, 1997 now U.S. Pat. No. 5,899,730 issued May 4, 1999. The applications have at least one common inventor and assignee. The parent application is incorporated herein by reference.

FIELD OF THE INVENTION

This invention relates generally to containers for storing semiconductor objects.

BACKGROUND OF THE INVENTION

Semiconductor fabrication processes involve fabricating several thousand individual devices on one wafer. Specifically, semiconductor wafers are cleaved to form chips, die, pieces and bars, which are later used in electronics and computer devices. After cleaving, the semiconductor chips are coated and are ready for further processing or storage. Due to the small size and delicate nature of the semiconductor chips, particularly careful storage procedures are required to prevent damage such as chipping or breaking.

Currently, a number of devices and methods are employed in handling and storing semiconductor chips. One such device involves the use of carrier trays having a plurality of cavities. Each cavity holds one semiconductor chip in place. There are numerous disadvantages to this method of storage. First, the size of the cavities must match closely with the size of the semiconductor chips to be stored so that the semiconductor chips do not fall out or move around within the cavity. Therefore, containers with different sized cavities are necessary to accommodate different size semiconductor chips. Often, in cases where a custom container for a particular semiconductor chip is not available, a custom fit container for a different size semiconductor chip will be used. In this situation, if the size of the cavity does not match closely with the semiconductor chips to be stored, the semiconductor chips will turn over within the cavity. This problem is time consuming and costly because each semiconductor chip must then be reoriented. Moreover, the semiconductor chips tend to break if there is room for them to move around the cavity. Finally, if particular care is not taken when the cavity tray is opened, the semiconductor chips will fall out resulting in the total destruction of the semiconductor chip.

Another device currently used for storing semiconductor chips is similar to the aforementioned device but further employs mechanical retaining members to help secure the chips in the cavities. While the mechanical retaining members alleviate some of the above mentioned problems, new problems are created. The mechanical retaining member must be customized to the size of the particular semiconductor chip being stored. Numerous mechanical retaining members are, therefore, needed. Furthermore, because of the delicate nature of the semiconductor chip, the retaining member must be carefully designed to prevent the retaining member from causing damage to the semiconductor chip. This results in additional design cost.

Another method of storing semiconductor chips employs an adhesive layer to retain the semiconductor chips in position, rather than a mechanical member. Current methods utilize pressure sensitive adhesive devices which use vacuum and porous film. Often, however, the adhesive sticks to the semiconductor chip after it has been removed causing serious damage. In addition, the level of adhesion tends to change over time and with ambient conditions. This causes the semiconductor chips to fall out of the device in cases where the adhesion decreases. Conversely, when the adhesion level increases, a higher level of force is required to remove the chips, increasing the likelihood of breakage.

In each of the above devices, an ejector pin is used to remove the semiconductor chips from the cavities. Due to the delicate nature of the semiconductor chips, the use of ejector pins can result in great damage to the chips.

SUMMARY OF THE INVENTION

The invention is an apparatus and method for storing semiconductor objects, where objects include wafers, wafer sections, bars, lasers, chips and other such practical devices. The storage container utilizes an inner frame, an outer stretching frame, temperature sensitive adherent vinyl film, a spacer of non-stick material and a mylar cover sheet to safely and securely store semiconductor objects. The invention provides for the safe and efficient storage of semiconductor objects for a relatively long period of time.

The invention overcomes numerous problems of the prior art by using a temperature sensitive adherent film to secure the semiconductor objects for storage. Semiconductor objects are placed on the temperature sensitive adherent film, preferably vinyl, which has been heated to the appropriate temperature range for the proper level of adhesion. The adhesion characteristics of the vinyl are such that adhesion is uniform throughout the surface of the material. Semiconductor objects will, therefore, evenly adhere to the vinyl at the proper temperature, for example 170° F. Importantly, the adhesion level of the vinyl does not vary with time. This permits the semiconductor objects to be readily removed from the vinyl without damage even though they have been stored for a relatively long period of time. The advantageous adhesive properties of the temperature sensitive vinyl overcome the disadvantages of the prior art which used ejector pins or collets to remove the semiconductor objects from storage.

After the semiconductor objects adhere to the vinyl surface, a spacer made of non-stick material and having a cutout for the semiconductor objects, is placed on top of the film. A mylar cover sheet is then applied to secure and protect the semiconductor objects from particulate and handling damage. The cover does not touch the semiconductor objects because of the spacer and thus will not damage the semiconductor objects. A label can then be placed on top of the mylar cover sheet for identification of the semiconductor objects.

The temperature sensitive adherent vinyl film coupled with the use of a spacer prevents any adhesive or mylar from sticking to the semiconductor objects. This feature of the invention overcomes a great disadvantage of the prior art which employ adhesives that would typically stick to the semiconductor objects upon removal.

Moreover, the same surface can be used to store semiconductor objects of various sizes because a flat adhesion surface is used rather than cavities. Therefore different storage containers are not necessary for different semiconductor objects. That is, wafers, wafer sections, bars, lasers and chips can all be stored by the invention. In addition different semiconductor objects can be stored on the same apparatus, at one time.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Figure 1:
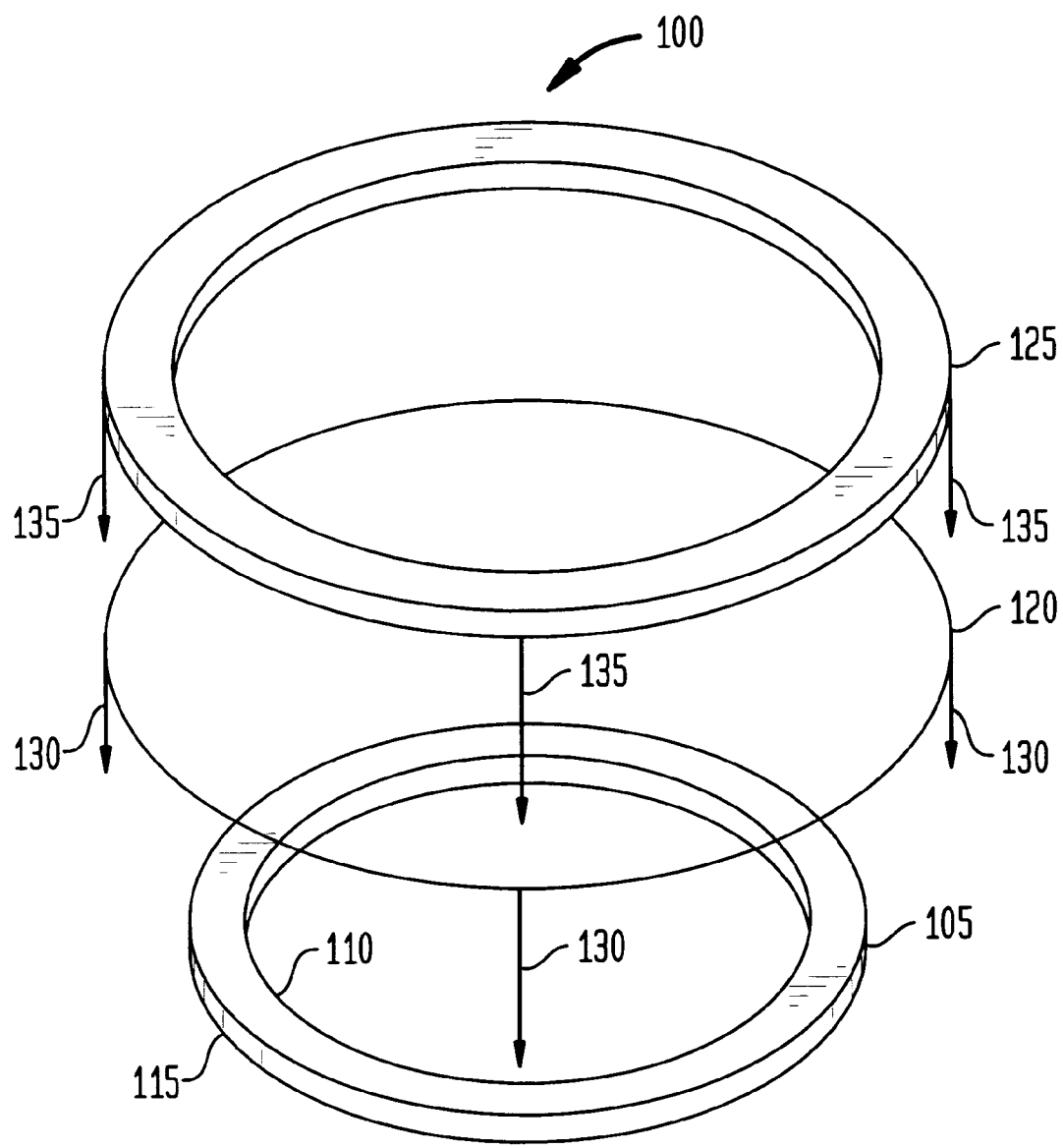
FIG. 1 is an isometric view of the assembly of the mounting structure.

For clarity of expression, a general overview of the invention is first given. An exemplary embodiment is then given, followed by an operational explanation of the invention.

Generally, the invention is directed to a storage container and a method for storing semiconductor objects in a safe and efficient manner. The container holds a plurality of semiconductor objects of various sizes, such as wafers, wafer sections, bars, lasers and chips. That is, different container structures of the invention are not necessary to store different sized semiconductor objects. The container of the invention stores the semiconductor objects with minimal threat of breakage. Semiconductor objects can be safely stored by the invention for a year or more and are easily and readily removable from the device. The invention uses a mounting structure and a cover to store the objects.

The size of the mounting structure determines the amount and size of semiconductor objects a single storage container can store. It is most efficient to store a plurality of semiconductor objects on the device in an essentially parallel configuration. This allows for easy placement of a label which is especially helpful in identifying the semiconductor objects after being stored for an extended period of time. The label can identify the type of semiconductor object stored, the date of storage and other pertinent information Semiconductor objects are placed on a mounting structure comprising an inner frame, an adherent film, and an outer stretching frame. In a preferred embodiment of the invention, the inner frame and outer stretching frame are ring-shaped and the adherent film is a temperature sensitive adherent vinyl as disclosed in U.S. patent application Ser. No. 08/970,982, entitled "Method of Handling Semiconductor wafers, Bars and Chips", having common assignee and herein incorporated by reference. By heating the temperature sensitive adherent vinyl to a certain range of temperatures, the adhesion level of the film is varied. For the adherent film described for the preferred embodiment, the vinyl will be heated to approximately 170° F. for the appropriate level of adhesion and then the semiconductor objects will be attached. The semiconductor objects are attached to the temperature sensitive adherent vinyl in a designated area, preferably the center area of the mounting structure.

The invention further comprises a cover. In a preferred embodiment of the invention, the cover comprises a spacer made of non-stick material and a mylar cover sheet. The spacer can be any thin film of material that has non-stick properties such as a paper mask. The spacer has a cutout corresponding to the designated area of the temperature sensitive adherent film, a perimeter equal to the inner perimeter of the inner frame and at least a thickness of a semiconductor object. After semiconductor objects are placed in the designated area, the spacer is placed on top, contacting the adherent film within the inner perimeter of the inner frame. The placement of the spacer leaves a portion of the adherent film around the inner stretching frame exposed. Finally, the mylar cover sheet is placed over the mounting structure, the semiconductor objects and the spacer, and adheres to the exposed portion of the adherent film. The mylar cover sheet securely protects the semiconductor objects from particulate and handling damage without touching the semiconductor objects.

Referring now to FIGS. 1–5, an exemplary embodiment of the invention and its components are illustrated. Although the description of the device is given where the structural embodiment of the frames of the mounting structure are ring-shaped, the mounting structure can be a variety of other shapes.

Figure 2:
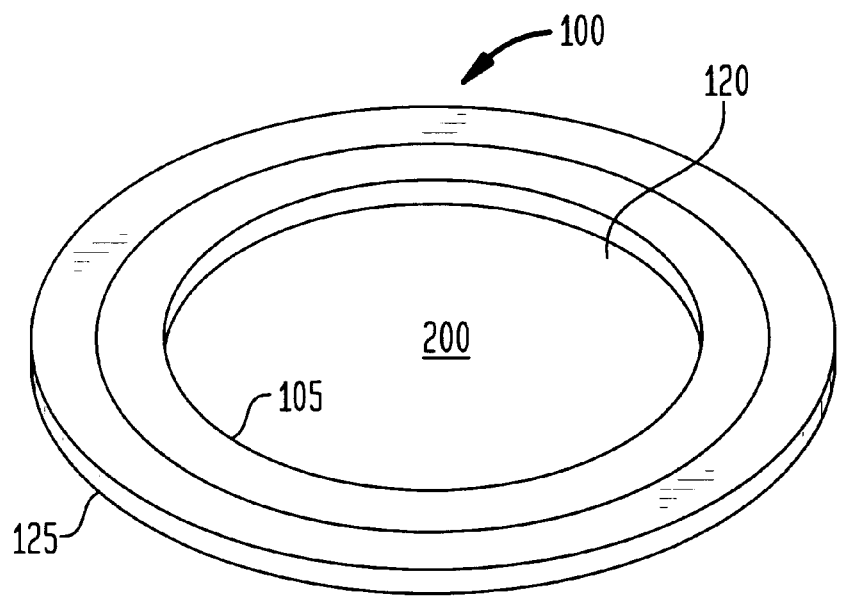
FIG. 2 is an isometric view of the fully assembled mounting structure.

FIG. 1 illustrates the assembly of a mounting structure 100 having an inner ring 105, outer stretching ring 125 and an adherent film 120. The inner ring 105 has an inner circumference 110 and an outer circumference 115. The adherent film 120, preferably a temperature sensitive adherent film, is circular in shape and has a circumference larger than the outer circumference 115. The outer stretching ring 125 fits around the inner ring 105 in a press fit. The adherent film 120 is draped over the inner ring 105 as shown by arrow 130. The outer stretching ring 125 is then placed over the adherent film 120 and the inner ring 105 as shown by arrow 135. The outer stretching ring 125 stretches the adherent film 120 taut over the inner ring 105 as shown in FIG. 2. FIG. 2 depicts the mounting structure 100 in its fully assembled form. The adherent film 120 is taut and stretched evenly in all directions because the mounting structure 100 is circular in shape. The mounting structure 100 defines a designated area 200 on the adherent film 120 for the placement of semiconductor objects 300 as shown in FIG. 3.

Figure 3:
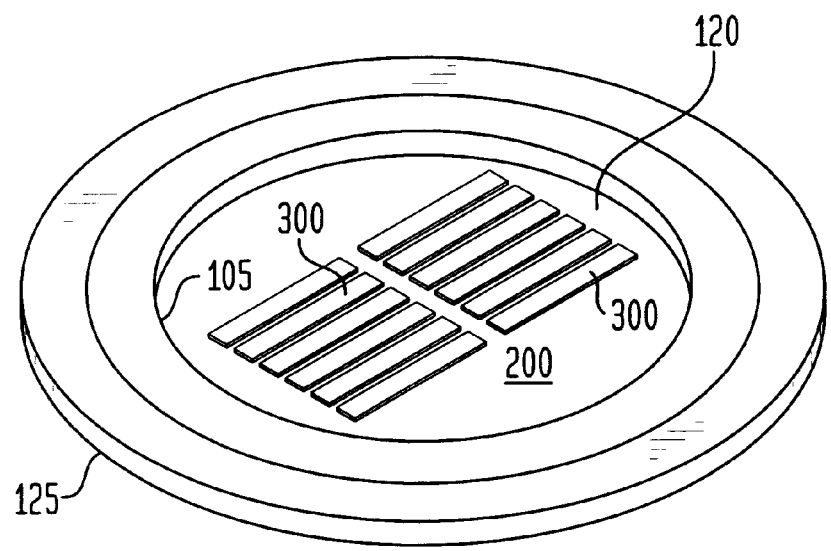
FIG. 3 is an isometric view of the mounting structure loaded with semiconductor objects.
Figure 4:
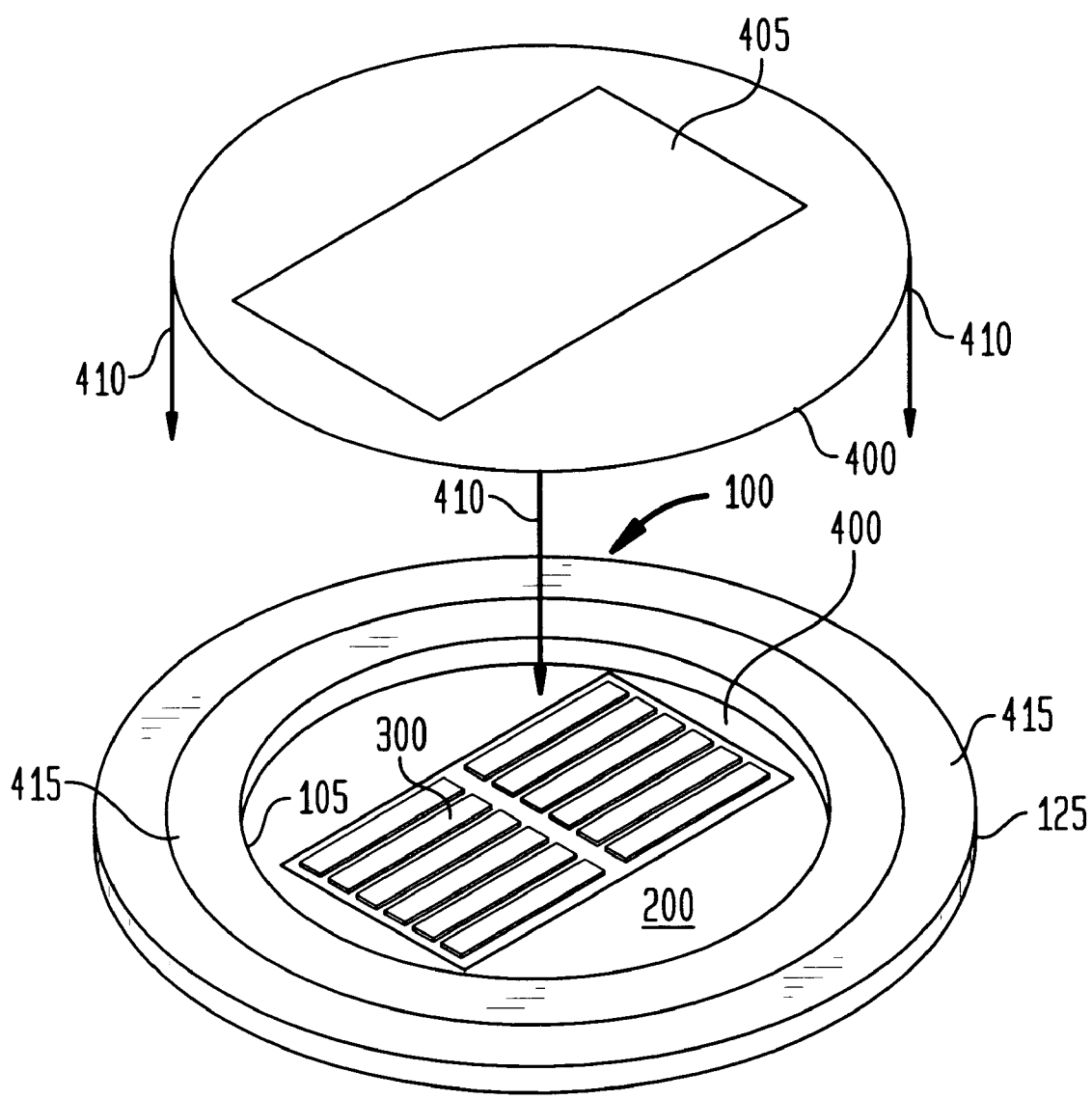
FIG. 4 is an isometric view of the loaded mounting structure and spacer.

Referring now to FIGS. 3 and 4, the mounting structure 100 is shown with semiconductor objects 300 loaded. The loaded semiconductor objects 300 have been processed and in cases where the semiconductor objects 300 are not immediately implemented into an electronic or computer device, the semiconductor objects 300 need to be securely and safely stored. An exemplary embodiment of a processing device for semiconductor objects 300 is disclosed in concurrently filed U.S. patent application Ser. No. 09/135, 186 entitled "Apparatus and Method for Rotating Semiconductor Objects," having common inventors and a common assignee, herein incorporated by reference.

The semiconductor objects 300 adhere to the designated area 200 of the mounting structure 100. The semiconductor objects 300 are placed in an essentially parallel configuration on the mounting structure 100. FIG. 4 further illustrates a spacer 400, preferably a paper mask or other non-stick material. The spacer 400 defines a cutout 405 which corresponds to the designated area 200 of the mounting structure 100 and has a thickness of at least a semiconductor object 300. The spacer 400 is placed on the adherent film 120 as shown by arrow 410. The positioning of the spacer 400 creates an exposed portion 415 of the adherent film 120 around the inner ring 105.

Figure 5:
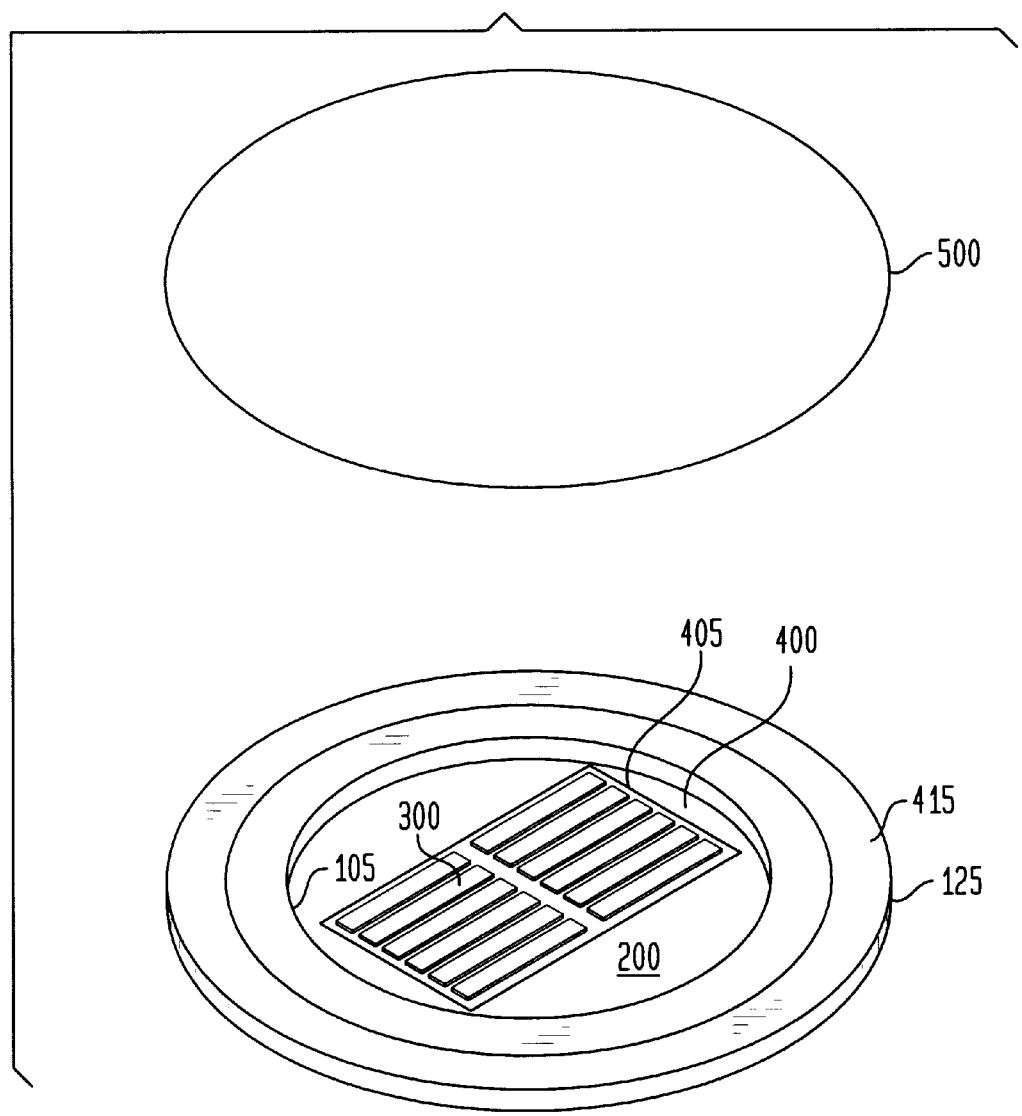
FIG. 5 is an isometric view of the assembly of the storage container.

FIG. 5 shows a mylar cover sheet 500. The mylar cover sheet 500 is circular in shape and must be at least the size of the outer stretching ring 125. The mylar cover sheet 500 protects the semiconductor objects 300 from particulate and handling damage.

Figure 6:
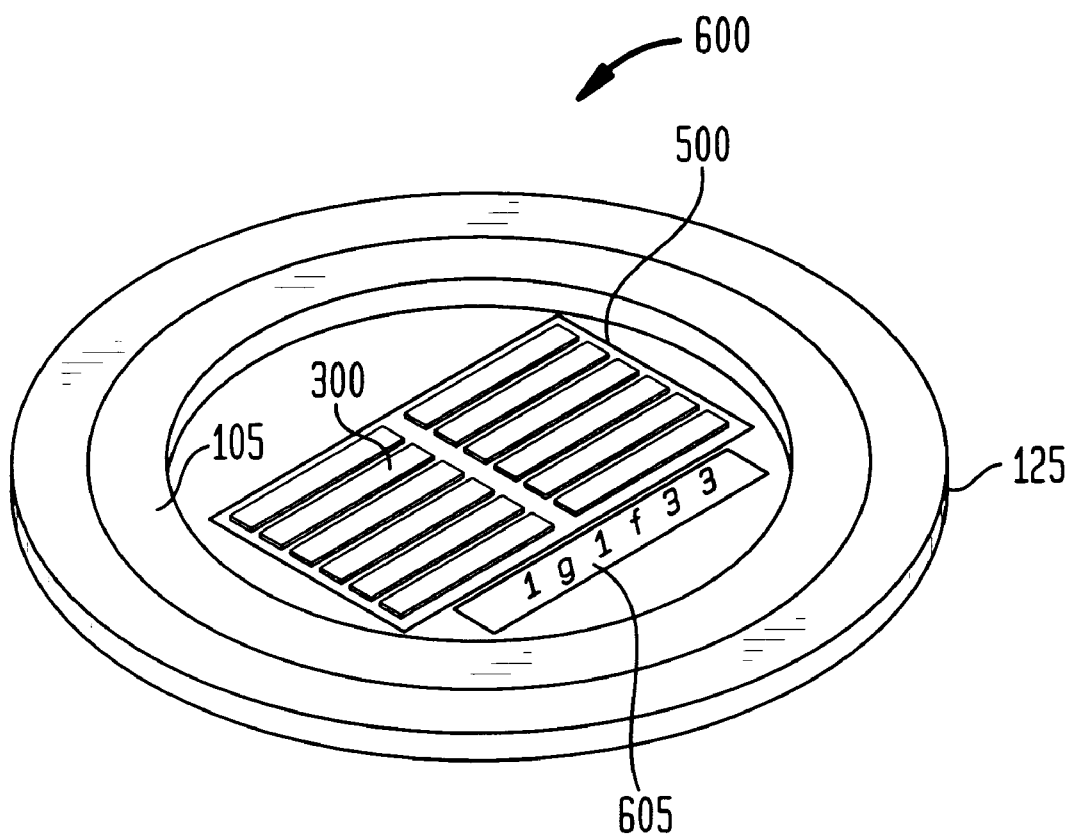
FIG. 6 is an isometric view of the storage container.

FIG. 6 shows a carrier 600 for storing semiconductor objects 300 fully loaded with semiconductor objects, covered and ready for storage. A label 605 is shown to clearly identify the kind of semiconductor objects 300 being stored by the device 600.

Operationally, the adherent film 120 of the mounting structure 100 as shown in FIG. 2 is heated to the appropriate temperature to attain desired level of adhesion. The semiconductor objects 300 are placed on the designated area 200 of the adherent film 120 and securely adhere to the adherent film 120 as shown FIG. 3. The spacer 400 is placed on a portion of the adherent film 120 located within the inner circumference 110 as shown by arrows 410 (FIG. 4). The cutout 405 corresponds with the designated area 200 so that the semiconductor objects 300 are not covered by the spacer 400. The spacer 400 prevents the mylar cover sheet 500 from touching the semiconductor objects 300.

Referring now to FIG. 5, the mylar cover sheet 500 is applied over the semiconductor objects 300 and the spacer 400. The mylar cover sheet 500 will adhere to the exposed portion 415 of the adherent film 120. More importantly, the mylar cover sheet 500 will not touch the semiconductor objects 300 because of the spacer 400. The mylar cover sheet 500 ensures that the semiconductor objects 300 remain positioned on the adherent film 120 without contacting and causing damage to the semiconductor objects 300. Furthermore, the mylar cover sheet 500 protects the semiconductor objects 300 from particulate and handling damage. A label 605 can then be placed directly on the mylar cover sheet 500. The label 605 allows for quick and easy removal of the correct semiconductor object 300.

While the invention has been described with reference to preferred embodiments, it should be appreciated by those skilled in the art that the invention may be practiced otherwise than as specifically described herein without departing from the scope of the invention. It is, therefore to be understood that the scope of the invention be limited only by the appended claims.

What is claimed:

1. A container for storing at least one semiconductor object comprising:
    a mounting structure, including a temperature sensitive adherent film, wherein at least one semiconductor object is adhered to a designated area of said temperature sensitive adherent film;
    a spacer having a cutout corresponding to said designated area, said spacer covering part of said mounting structure; and
    a mylar cover sheet;
        wherein said mylar cover sheet is placed on said mounting structure and said spacer for securing and protecting said at least one semiconductor object in place without touching said at least one semiconductor object.

2. The container of claim 1, wherein said mounting structure further comprises:
    an inner frame; and
    an outer stretching frame;
    wherein said temperature sensitive adherent film is draped over said inner frame and said outer stretching frame stretches said temperature sensitive adherent film taut by press fitting with said inner frame.

3. The container of claim 2, wherein said spacer has a perimeter equivalent to an inner perimeter of said inner frame and at least a thickness of said at least one semiconductor object, said spacer covering said temperature sensitive adherent film within said inner perimeter of said inner frame leaving an exposed portion of said temperature sensitive adherent film along the inner frame.

4. The container of claim 3, wherein said mylar cover sheet has at least a perimeter of an outer perimeter of said inner frame, said mylar cover sheet covering and protecting said at least one semiconductor object without touching said at least one semiconductor object, said mylar cover sheet adhering to said exposed portion of said temperature sensitive adherent film.

5. The container of claim 1 wherein said temperature sensitive adherent film is vinyl.

6. The container of claim 1 wherein said mounting structure further comprises:
    an inner ring; and
    a outer stretching ring;
    wherein said adherent film is draped over said inner ring and said outer stretching ring stretches said adherent film by press fitting around said inner ring.

7. The container of claim 6 wherein said spacer has a circumference equivalent to the inner circumference of said inner ring and at least a thickness of said at least one semiconductor object, said spacer covering said adherent film within said inner circumference of said inner frame leaving an exposed portion of said adherent film along said inner ring.

8. The container of claim 7, wherein said mylar cover sheet has at least a circumference of an outer circumference of said inner ring, said mylar cover sheet covering and protecting said at least one semiconductor object without touching said at least one semiconductor object, said mylar cover sheet adhering to said exposed portion of said adherent film.

9. A container for storing at least one semiconductor object comprising:
    an inner ring;
    temperature sensitive adherent film, said temperature sensitive adherent film draping over said inner ring to form a partially enclosed space, wherein at least one semiconductor object adheres to a designated area of said temperature sensitive adherent film inside said partially enclosed space;
    an outer stretching ring, wherein said outer stretching ring press fits around said inner ring and stretches said temperature sensitive adherent film taut over said inner ring; and
    a cover disposed about an opposite portion of said inner ring so as to complete said partial enclosure, thereby enclosing said at least one semiconductor object.

10. The container of claim 9, wherein said cover further comprises:
    a spacer having a cutout corresponding to said designated area, said spacer covering part of said temperature sensitive adherent film; and
    a mylar cover sheet;
    wherein said mylar cover sheet is placed over said spacer and said temperature sensitive adherent film for securing and protecting said at least one semiconductor object in place without touching said at least one semiconductor object.

11. A method for storing at least one semiconductor object comprising the steps of:
    forming a partial enclosure from a juxtaposition of a temperature sensitive adherent film and a spacing structure arranged to generally define a periphery about a designated area of said temperature sensitive adherent film;
    heating said designated area of said temperature sensitive adherent film and adhering at least one semiconductor object thereto; and placing a cover over said at least one semiconductor object and said temperature sensitive adherent film so as to complete said partial enclosure, wherein said completed enclosure protects and securely fastens said at least one semiconductor object.

12. The method of claim 11, wherein said step of forming said partial enclosure further comprises the step of draping said temperature sensitive adherent film over an inner ring and stretching said temperature sensitive adherent film taut by press fitting an outer stretching ring with said inner ring.

13. The method of claim 11, wherein said step of heating said designated area of said temperature sensitive adherent film further comprises the step of heating said designated area to a proper temperature to attain a desired level of adhesion.

14. The method of claim 11 wherein said step of forming said partial enclosure further includes the step of:

placing a spacer on part of said temperature sensitive adherent film, said spacer having a cutout corresponding to said designated area of said temperature sensitive adherent film;

and said step of placing said cover includes the step of:

adhering a mylar cover sheet to an exposed portion of said temperature sensitive adherent film;

wherein said spacer prevents said mylar cover sheet from touching said at least one semiconductor object, and said mylar cover sheet secures and protects said at least one semiconductor object from particulate and handling damage while being stored.

* * * * *